(12) United States Patent
Hashemi et al.

(10) Patent No.: US 9,478,642 B2
(45) Date of Patent: Oct. 25, 2016

(54) SEMICONDUCTOR JUNCTION FORMATION

(71) Applicant: GLOBALFOUNDRIES Inc., Grand Cayman (KY)

(72) Inventors: Pouya Hashemi, White Plains, NY (US); Shogo Mochizuki, Clifton Park, NY (US); Alexander Reznicek, Troy, NY (US); Dominic J. Schepis, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/537,832

(22) Filed: Nov. 10, 2014

(65) Prior Publication Data
US 2016/0133727 A1 May 12, 2016

(51) Int. Cl.
| | | |
|---|---|---|
| *H01L 29/66* | (2006.01) |
| *H01L 29/78* | (2006.01) |
| *H01L 29/06* | (2006.01) |
| *H01L 29/08* | (2006.01) |
| *H01L 29/417* | (2006.01) |

(52) U.S. Cl.
CPC ..... *H01L 29/66795* (2013.01); *H01L 29/0688* (2013.01); *H01L 29/0847* (2013.01); *H01L 29/41791* (2013.01); *H01L 29/6653* (2013.01); *H01L 29/7851* (2013.01)

(58) Field of Classification Search
CPC ............. H01L 29/6681; H01L 29/785; H01L 29/0653; H01L 29/66795; H01L 29/16; H01L 29/165; H01L 29/66545; H01L 29/0847
USPC ........................................................ 257/197
See application file for complete search history.

(56) References Cited

U.S. PATENT DOCUMENTS

| | | | |
|---|---|---|---|
| 8,114,761 B2 | 2/2012 | Mandrekar et al. | |
| 8,310,013 B2 | 11/2012 | Lin et al. | |
| 8,367,498 B2* | 2/2013 | Chang ................. | H01L 29/7848 257/E21.409 |
| 8,525,271 B2* | 9/2013 | Gregory .......... | H01L 21/823807 257/315 |
| 8,609,499 B2* | 12/2013 | Ho ..................... | H01L 29/66795 257/E21.619 |
| 8,723,272 B2* | 5/2014 | Liu .................... | H01L 29/66795 257/401 |
| 8,916,460 B1* | 12/2014 | Kwon ............... | H01L 29/66795 257/192 |
| 9,048,262 B2* | 6/2015 | Adam ................. | H01L 29/6681 |
| 9,093,550 B1* | 7/2015 | Zhao ........................ | H01L 21/82 |
| 9,105,559 B2* | 8/2015 | Basker .................... | H01L 21/18 |
| 9,112,057 B1* | 8/2015 | Pradhan .............. | H01L 29/1079 |

(Continued)

OTHER PUBLICATIONS

Z. Ye et al., "High Tensile Strained In-Situ Phosphorus Doped Silicon Epitaxial Film for nMOS Applications,." ECS Transactions, vol. 50, No. 9, 2013, pp. 1007-1011.

(Continued)

*Primary Examiner* — Michael Lebentritt
(74) *Attorney, Agent, or Firm* — Yuanmin Cai; Andrew M. Calderon; Roberts Mlotkowski Safran Cole & Calderon, P.C.

(57) ABSTRACT

A semiconductor structure, such as a FinFET, etc., includes a bi-portioned junction. The bi-portioned junction includes a doped outer portion and a doped inner portion. The dopant concentration of the outer portion is less than the dopant concentration of the inner portion. An electrical connection is formed by diffusion of the dopants within outer portion into a channel region and diffusion of the dopants within the outer portion into the inner region. A low contact resistance is achieved by a contact electrically contacting the relatively higher doped inner portion while device shorting is limited by the relatively lower doped outer portion.

16 Claims, 6 Drawing Sheets

(56) References Cited

U.S. PATENT DOCUMENTS

| | | | |
|---|---|---|---|
| 2011/0193141 A1* | 8/2011 | Lin | H01L 29/045 257/255 |
| 2013/0032865 A1* | 2/2013 | Chan | H01L 21/2254 257/288 |
| 2014/0134818 A1 | 5/2014 | Cheng et al. | |
| 2014/0159162 A1 | 6/2014 | Cai et al. | |
| 2014/0203338 A1 | 7/2014 | Kelly et al. | |
| 2015/0108573 A1* | 4/2015 | Liu | H01L 21/823487 257/347 |
| 2015/0115370 A1* | 4/2015 | Liu | H01L 27/0886 257/401 |
| 2015/0279958 A1* | 10/2015 | Greene | H01L 29/6681 257/192 |

OTHER PUBLICATIONS

X. Li et al., "Selective Epitaxial Si:P Film for nMOSFET Application: High Phosphorous Concentration and High Tensile Strain," ECS and SMEQ Joint International Meeting, 2014, Abstract 1853, downloaded Aug. 1, 2014.

* cited by examiner

SEMICONDUCTOR JUNCTION FORMATION

FIELD

Embodiments of invention generally relate to semiconductor devices, design structures for designing a semiconductor device, and semiconductor device fabrication methods. More particularly, embodiments relate to forming a semiconductor structure source/drain region and channel region junction.

BACKGROUND

Junction formation in a FinFET semiconductor structure is accomplished by outdiffusion from a source/drain (SD) region into the channel region under a spacer of an associated gate. Typically, the more abrupt the junction then better. A high dopant level in the SD region is typically desirable to form a good contact with and to achieve a low contact resistance between the SD region and a SD contact. Unfortunately the high dopant level close to the gate may lead to high diffusion of dopant under the gate spacer during extension formation anneal and may short the device. With respect to dopant concentrations in junction formation, there is a trade off between shorting the device and forming a good contact with low contact resistance.

SUMMARY

Embodiments of invention generally relate to semiconductor devices, and more particularly to design structures, semiconductor devices, and fabrication of semiconductor devices.

In an embodiment, a semiconductor device fabrication process includes forming a fin upon a semiconductor substrate and forming a gate stack upon the semiconductor substrate and upon and orthogonal to the fin, forming a channel region under the gate stack by recessing the fin and semiconductor substrate exterior to the gate stack, forming an inner junction portion upon the recessed semiconductor substrate, and forming an outer junction portion upon the recessed semiconductor substrate that electrically connects the channel region and the inner junction portion.

In another embodiment, a semiconductor device includes a channel region upon a semiconductor substrate, a gate stack upon the channel region, and a bi-portioned junction comprising an inner portion upon the semiconductor substrate and an outer portion that electrically connects the channel region and the inner portion.

In another embodiment of the present invention, the semiconductor device is included in a design structure tangibly embodied in a machine readable medium for designing, manufacturing, or testing an integrated circuit.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. These exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Embodiments of invention generally relate to semiconductor devices, and more particularly to a three dimensional semiconductor structure utilizing a fin, such as a FinFET. A FinFET device may include a plurality of fins formed in a wafer and a gate covering a portion of the fins. The portion of the fins covered by the gate may serve as a channel region of the device. Portions of the fins may also extend out from under the gate and may serve as the SD regions of the device. Semiconductor structures including FinFETs may be implemented with gate first or gate last FinFET fabrication process techniques. In gate first processes, metal layers over first structure areas (e.g. NMOS areas, etc.) and second structure areas (e.g. PMOS areas, etc.) are formed and patterned to form gate structures followed by typical CMOS processing such as forming of the source and drain, forming spacers and depositing of the interlevel dielectric. In a gate last process, a dummy gate structure is formed followed by typical CMOS processing including formation of the source and drain, formation of spacers and deposition of the interlevel dielectric. Thereafter, the dummy gate structure is removed followed by deposition of a replacement gate structure.

Figure 1:
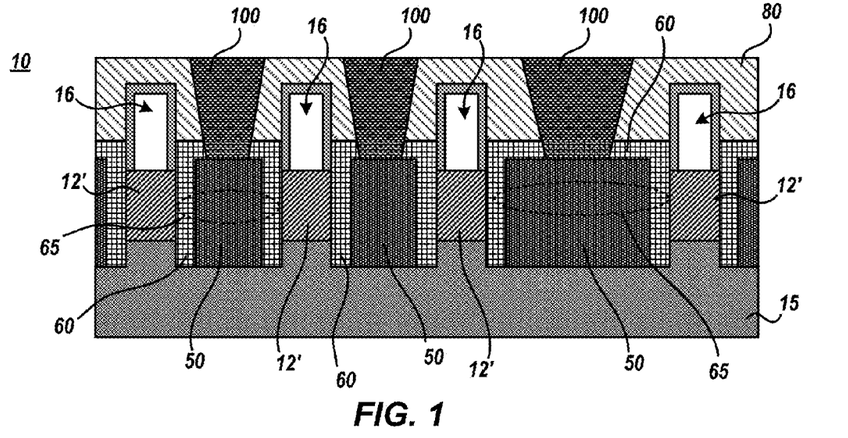
FIG. 1-FIG. 11 depict cross section views of exemplary semiconductor structures at intermediate stages of semiconductor device fabrication, in accordance with various embodiments of the present invention.

FIG. 1 depicts a cross section view of an exemplary semiconductor structure 10 at an intermediate state of semiconductor device fabrication. A bi-portioned junction 65 includes an outer portion 60 and an inner portion 50. A junction is formed by diffusion of the outer portion 60 into a channel region 12' while the inner portion 50 electrically contacts a SD contact 100. The outer portion 60 is doped with a lower dopant concentration to form a junction with the channel region 12' and to prevent shorting, while the inner portion 50 is doped with a higher dopant concentration to achieve a low contact resistance with SD contact 100.

Referring now to the FIG. 2-FIG. 11 exemplary process steps of forming the exemplary semiconductor structure 10 in accordance with embodiments of the present invention are shown, and will now be described in greater detail below. It should be noted that some of the figures depict cross section views of structure 10 oriented as a cross section of a fin and perpendicular to a plurality of gates. Furthermore, it should be noted that while this description may refer to some components of the structure 10 in the singular tense, more than one component may be depicted throughout the figures and like components are labeled with like numerals. The specific number of components depicted in the figures and the cross section orientation was chosen for illustrative purposes only.

Figure 2:
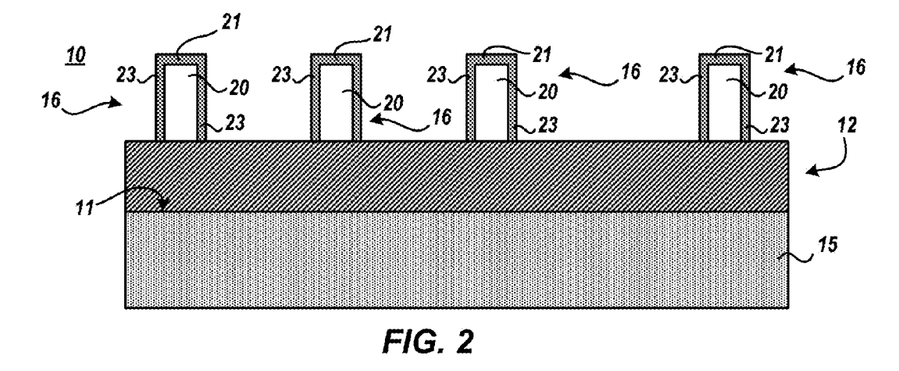

FIG. 2 depicts a cross section view of a semiconductor structure 10 at an intermediate stage of semiconductor device fabrication, in accordance with various embodiments of the present invention. At this stage of fabrication, fins 12 and gate stacks 16 are formed upon substrate 15.

Substrate 15 may be, for example, a layered substrate such as a silicon-on-insulator (SOI), a SiGe-on-insulator (SGOI) or III-V on insulator. Substrate 15 may include a base substrate, a buried dielectric layer formed on top of the base substrate, and a SOI layer formed on top of the buried dielectric layer. The buried dielectric layer may isolate the SOI layer from the base substrate. Fins 12 may be etched from the SOI layer. Note, though one fin 12 is shown in e.g. FIG. 2, additional fins 12, visible at various cross sections into or out of the page, may be further formed. The base substrate may be made from any of several known semiconductor materials such as, for example, silicon, germanium, silicon-germanium alloy, silicon carbide, silicon-germanium carbide alloy, or other similar semiconductor materials. Non-limiting examples of compound semiconductor materials include gallium arsenide, indium arsenide, and indium phosphide. Typically the base substrate may be about, but is not limited to, several hundred microns thick. For example, the base substrate may have a thickness ranging from 0.5 mm to about 1.5 mm.

The buried dielectric layer 13 may include any of several dielectric materials, for example, oxides, nitrides and oxynitrides of silicon. The buried dielectric layer 13 may also include oxides, nitrides and oxynitrides of elements other than silicon. In addition, the buried dielectric layer 13 may include crystalline or non-crystalline dielectric material. Moreover, the buried dielectric layer 13 may be formed using any of several known methods, for example, thermal or plasma oxidation or nitridation methods, chemical vapor deposition methods, and physical vapor deposition methods. The buried dielectric layer 13 may have a thickness ranging from about 5 nm to about 250 nm. In one embodiment, the buried dielectric layer may have a thickness ranging from about 120 nm to about 200 nm.

The SOI layer may include any of the several semiconductor materials included in the base substrate. In general, the base substrate and the SOI layer may include either identical or different semiconducting materials with respect to chemical composition, dopant concentration and crystallographic orientation. The base substrate and the SOI layer include semiconducting materials that include at least different crystallographic orientations. Typically, the SOI layer may include a thickness ranging from about 5 nm to about 100 nm. In one embodiment, the SOI layer may have a thickness ranging from about 25 nm to about 30 nm. Methods for forming the SOI layer are well known in the art. Non-limiting examples include SIMOX (Separation by Implantation of Oxygen), wafer bonding, and ELTRAN® (Epitaxial Layer TRANsfer). It may be understood by a person having ordinary skill in the art that the plurality of fins 12 may be etched from the SOI layer. Because the plurality of fins 12 may be etched from the SOI layer, they too may include any of the characteristics listed above for the SOI layer.

Semiconductor structure 10 may also include a plurality of gate stacks 16. Gate stack 16 may include, for example, a gate 20, a gate cap 21, and a spacer 23, etc. Generally, gate stack 16 may be formed by using widely known techniques. For example, gate stack 16 may be formed by first providing a gate dielectric (not shown) upon structure 10 (e.g. upon substrate 15 and fins 12) utilizing a conventional deposition process including, for example, chemical vapor deposition, plasma enhanced chemical vapor deposition or chemical solution deposition. Gate 20 may be formed upon the gate dielectric and a gate cap 21 may be formed atop gate 20. Spacers 23 may be formed on sidewalls of gate 20, gate cap 21, etc. Generally, gate stack 16 may be formed by other known processes without deviating from the spirit of those embodiments herein claimed. When substrate 15 is a bulk substrate, the fins 12 may be etched from the base substrate material and a dielectric layer may formed upon the base substrate adjacent to the fins 12. The gate stacks may be formed upon the dielectric layer and upon the fins 12.

Figure 3:
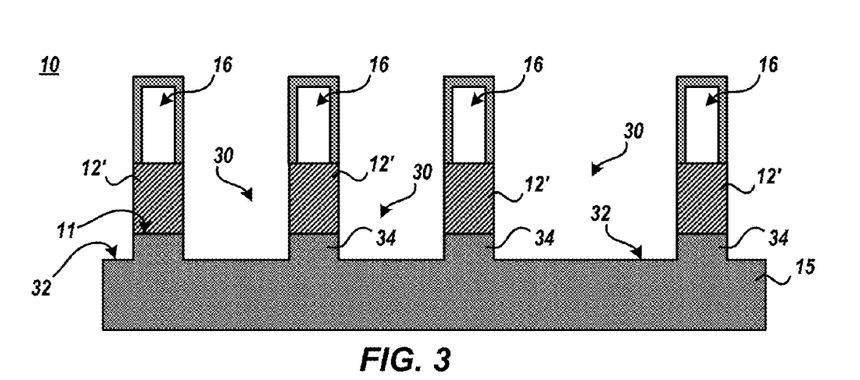

FIG. 3 depicts a cross section view of an exemplary semiconductor structure 10 at an intermediate stage of semiconductor device fabrication, in accordance with various embodiments of the present invention. At this stage of fabrication, recess regions 30 are formed. In certain embodiments, recess region 30 may be formed by removing portions of fins 12. In certain embodiments, recess region 30 may be formed by removing portions of fins 12 and portions of substrate 15 within SD regions. In certain embodiments, recess regions 30 are formed by removing portions of fins 12, portions of substrate 15, etc. generally between gate stacks 16.

The portions of fins 12 and/or portions of substrate 15 (e.g. dielectric layer 13, etc.) may be removed using any suitable etching technique such as dry etch, wet etch, or combination of both. The portions of fins 12 may be removed by e.g. known patterning and etching procedures of the VLSI arts, such as, for instance, reactive ion etching (RIE). A first etch process may remove portions of fins 12 and may penetrate to an upper surface 11 of substrate 15 and a second etch process may remove portions of substrate 15. However, in certain embodiments, a single etch process may both remove portions of fins 12 and portions of substrate 15. The remaining fin portions may be interchangeably referred to herein as fin portions 12' or channel regions 12' and may be generally positioned below respective gate stacks 16. The remaining substrate 15 portions are herein referred to as substrate portions 34 and are generally positioned below respective channel regions 12'.

The etching procedures to form recess regions 30 may be chosen to obtain a depth and side profile according to design purposes and to retain one or more crystalline surface(s) for subsequent epitaxy formation. For instance, recess regions 30 can be formed by a directional dry etch which can form substantially straight sidewalls or by a wet (or other isotropic) etch process which can form angled sidewalls, undercuts, etc. In certain embodiments, the depth of recess region 30 may be sufficient to allow for bi-portioned junction 65 formation therein as is further described below. In certain embodiments, the depth of recess regions 30 may differ relative to each other. For example the depth of recess regions 30 may differ depending up the pitch dimensions between gate stacks 16, etc. In certain embodiments, a bottom surface 32 of recess region 30 is below upper surface 11 of substrate 15. Generally, recess regions 30 may be formed by other known processes without deviating from the spirit of those embodiments herein claimed.

Figure 4:
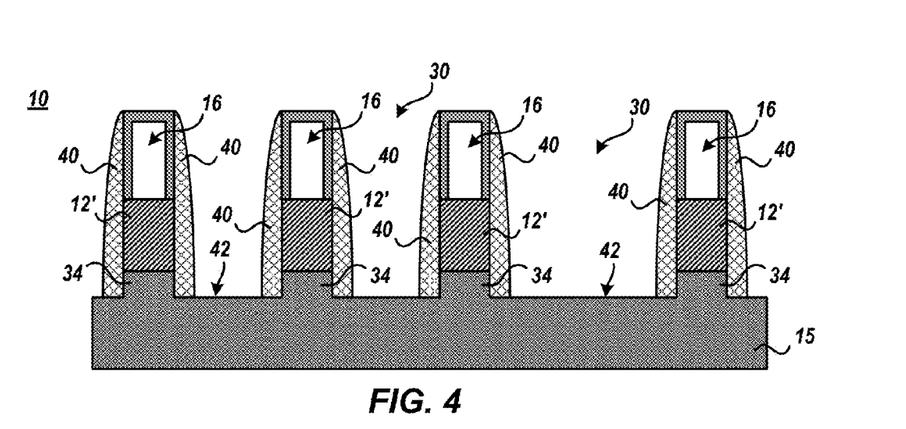

FIG. 4 depicts a cross section view of an exemplary semiconductor structure 10 at an intermediate stage of semiconductor device fabrication, in accordance with various embodiments of the present invention. At this stage of fabrication, sacrificial spacer 40 is formed upon gate stack 16 sidewalls, channel region 12' sidewalls, and upon substrate portion 34 sidewalls. Sacrificial spacer 40 may include a first portion formed upon first gate stack 16, channel region 12', and substrate portion 34 sidewalls and a second portion formed upon opposing gate stack 16, channel region 12', and substrate portion 34 sidewalls.

Sacrificial spacer 40 may be composed of a dielectric material, such as an oxide, nitride, oxynitride, silicon nitride, silicon oxide, silicon oxynitride, amorphous carbon, or any other suitable combination thereof that is selective to the material of spacer 23 such that the material of spacer 23 may be retained during the removal of sacrificial spacer 40. For example, spacer 40 may be oxide. Sacrificial spacer 40 may be provided by forming processes, such as deposition or thermal growth. For example, Sacrificial spacer 40 may be formed by deposition processes, such as chemical vapor deposition (CVD). The first portion and second portion of sacrificial spacer 40 may have a width that ranges from e.g. 1 nm to 60 nm, although lesser and greater thickness have also been contemplated herein. More generally, the thickness of the first portion and second portion of sacrificial spacer 40 is chosen so that the sacrificial spacer 40 remains subsequent to epitaxy pre-cleaning processes that cleans an exposed surface 42 of substrate 15. Sacrificial spacers 40 may be used to ensure a suitable amount of material protects associated gate stack 16, channel region 12', and substrate portion 34 from formation or removal techniques of subsequent stages of semiconductor device fabrication. Typically, sacrificial spacers 40 may include a single material layer; however, sacrificial spacers 40 may include multiple layers of material. According to various embodiments of the present invention, the formation of sacrificial spacers 40 result in an exposed surface 42 where sacrificial spacers 40 do not cover substrate 15. The width of the exposed surface 42 may be a desired contact width of a SD contact 100 and SD region. Generally, sacrificial spacers 40 may be formed by other known processes without deviating from the spirit of those embodiments herein claimed.

Figure 5:
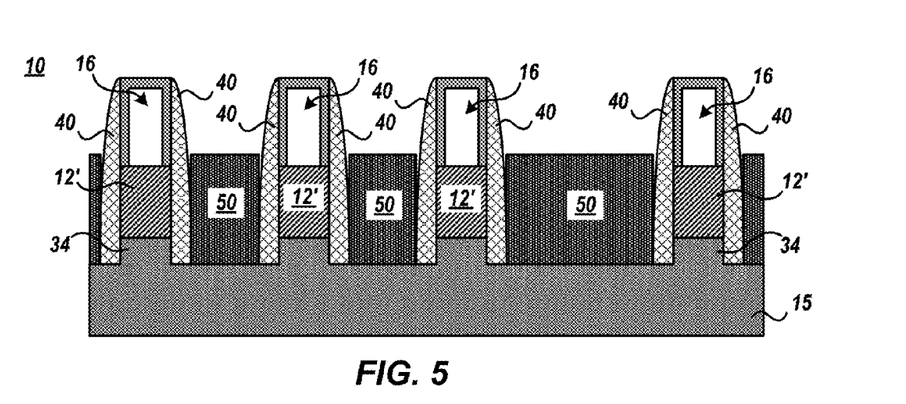

FIG. 5 depicts a cross section view of an exemplary semiconductor structure 10 at an intermediate stage of semiconductor device fabrication, in accordance with various embodiments of the present invention. At this stage of fabrication, inner portion 50 is formed within recess region 30. In various embodiments, inner portion 50 is epitaxial material grown from exposed surface 42 of substrate 15.

Generally, epitaxial growth, grown, deposition, formation, etc. means the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gasses are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a <100> crystal surface will take on a <100> orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatuses that are suitable for use in forming epitaxial semiconductor material of the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for forming the carbon doped epitaxial semiconductor material typically ranges from 550° C. to 900° C. Although higher temperature typically results in faster deposition, the faster deposition may result in crystal defects, film cracking, etc.

A non limiting list of exemplary epitaxial materials are: silicon germanium alloy (SiGe), Silicon (Si), in-situ boron doped SiGe or Si, in situ phosphorus or arsenic doped Si or SiGe, or doped III-V semiconductors. Generally, inner portion 50 is formed upon exposed surface 42 of substrate 15. In various embodiments, exposed surface 42 of substrate 15 has a <100> orientation and epitaxial grown material is formed thereupon whereby inner portion 50 is formed.

The material of the substrate 15 may itself serve as the seed surface inner portion 50. The inner portion 50 growth may be carried out in a selective manner, meaning that the epitaxial growth occurs only over exposed semiconductor surfaces, for instance from exposed surface 42 while other surfaces (e.g. surfaces of dielectrics) stay essentially free of the epitaxy material. Selective epitaxial growth has known techniques in the art. In certain embodiments, the epitaxial growth may be timed and stopped such that multiple instances of inner portion 50 are generally uniform. For instance, the geometric properties of inner portion 50 associated with one gate stack 16 are similar to inner portion 50 associated with another gate stack 16.

In certain embodiments, inner portion 50 epitaxy material may be doped. Such doping may be performed during the epitaxial growth, in so called in-situ doping schemes, as known in the art. Both p-type and n-type dopants are well known in the art, and any of them may be used in the embodiments of the present disclosure for doping inner portion 50. In certain embodiments, inner portion 50 epitaxy material may be highly doped. For example, inner portion 50 may be highly arsenic doped Si with a dopant concentration between $5 \times 10^{20}$ cm$^{-3}$-$8 \times 10^{20}$ cm$^{-3}$. Generally, inner portion 50 may be formed by other known processes without deviating from the spirit of those embodiments herein claimed.

Figure 6:
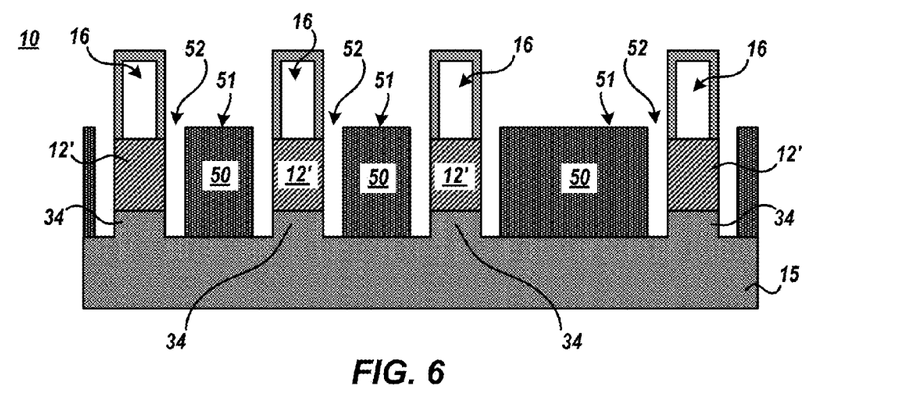

FIG. 6 depicts a cross section view of a semiconductor structure 10 at an intermediate stage of semiconductor device fabrication, in accordance with various embodiments of the present invention. At this stage of fabrication, sacrificial spacers 40 are selectively removed to expose gate stack 16 sidewalls, channel region 12' sidewalls, and substrate portion 34 sidewalls, etc. The sacrificial spacers 40 may be removed using any suitable etching technique such as dry etch, wet etch, or combination of both to selectively remove sacrificial spacers 40 to expose gate stack 16 sidewalls, channel region 12' sidewalls, substrate portion 34 sidewalls etc. For example, the sacrificial spacers 40 can be removed using dry plasma oxygen ash process followed by a wet cleaning process. In certain implementations, the etching technique may require a etch mask to be formed that resists etching to protect portions of semiconductor device 10. Following the formation of the etch mask, the sacrificial spacers 40 may then removed by an etch process having high selectivity to removing the material of the sacrificial spacers 40 without substantially etching the etch mask, spacers 23, channel regions 12', substrate 15, inner portions 50, etc. Following the removal of sacrificial spacers 40, the etch mask may be removed. Generally, sacrificial spacers 40 may be removed by other known processes without deviating from the spirit of those embodiments herein claimed. In certain embodiments, upon the removal of sacrificial spacers 50, junction trenches 52 are formed between inner portion 50 and an associated stack of gate stack 16, channel region 12', and substrate portion 34.

Figure 7:
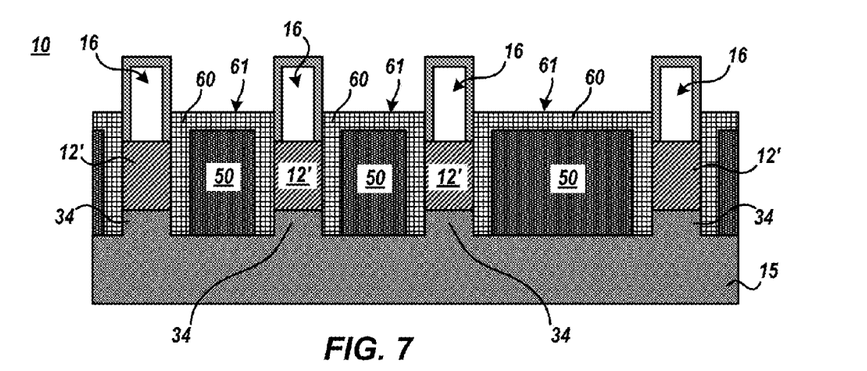

FIG. 7 depicts a cross section view of an exemplary semiconductor structure 10 at an intermediate stage of semiconductor device fabrication, in accordance with various embodiments of the present invention. At this stage of fabrication, outer portion 60 is formed within junction trench 52. In various embodiments, outer portion 60 is epitaxial material grown from substrate 15 exposed by junction trench 52.

The material of the substrate 15 may itself serve as the seed surface outer portion 60. The outer portion 60 growth may be carried out in a selective manner, meaning that the epitaxial growth occurs only over exposed semiconductor surfaces, for instance from an exposed surface of substrate 15 that is exposed by junction trench 52 while other surfaces (e.g. surfaces of dielectrics) stay essentially free of the epitaxy material. Selective epitaxial growth has known techniques in the art. In certain embodiments, the epitaxial growth may be timed and stopped such that a top surface 61 of outer portion 60 is coplanar with a top surface 51 of inner portion 50. In other embodiments, epitaxial growth will continue such that outer portion 60 material may form upon top surface 51 of inner portion 50. Further, in certain embodiments, the dopant type of outer portion 60 may be similar to the dopant type of inner portion 50 (e.g., inner portion 50 and outer portion 60 may be both doped with either n-type or p-type dopants, etc.).

In certain embodiments, outer portion 60 epitaxy material may be doped. Such doping may be performed during the epitaxial growth, in so called in-situ doping schemes, as known in the art. Both p-type and n-type dopants are well known in the art, and any of them may be used in the embodiments of the present disclosure for doping outer portion 60. In certain embodiments, outer portion 60 epitaxy material may be highly doped. For example, outer portion 60 may be highly phosphorus doped Si with a dopant concentration between $2 \times 10^{20}$ cm$^{-3}$-$4 \times 10^{20}$ cm$^{-3}$. Therefore, in certain embodiments the dopant concentration of outer portion 60 may be less than the dopant concentration of inner portion 50. Further, in certain embodiments, the dopant of outer portion 60 and the dopant of inner portion 50 are chosen such that the dopant of inner portion 50 diffuses slower than the outer portion 60 dopant in silicon. In this manner the relatively lower dopant concentration of outer portion 60 may be maintained to limit the risk of structure 10 shorts. In certain embodiments, excess outer portion 60 material (e.g., material above inner portion 50, etc.) may be removed by e.g., an etching process such as a short directional RIE with the dopant of inner portion 50 as endpoint detection. Generally, outer portion 60 may be formed by other known processes without deviating from the spirit of those embodiments herein claimed.

Figure 8:
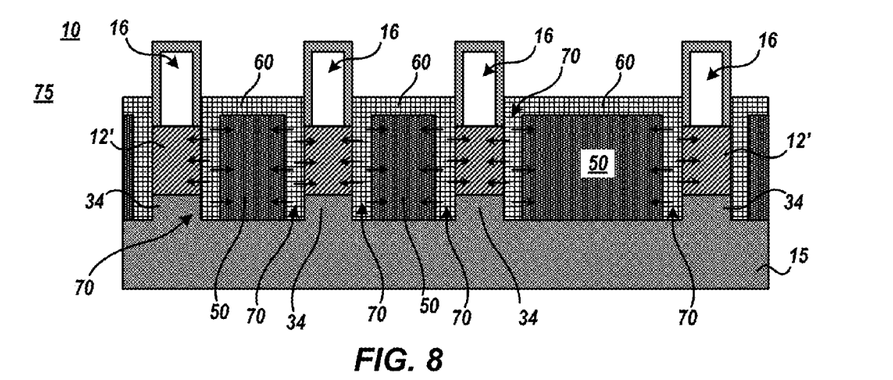

FIG. 8 depicts a cross section view of an exemplary semiconductor structure 10 at an intermediate stage of semiconductor device fabrication, in accordance with various embodiments of the present invention. At this stage of fabrication, junctions 70 are formed upon structure 10. In certain embodiments, junctions 70 may be formed by subjecting structure 10 to a thermal process 75. For example, thermal process 75 may be an anneal such as rapid thermal anneal, furnace anneal, flash anneal, laser anneal or any suitable combination of those techniques. An annealing temperature may range from 600° to 1300° C. with an anneal time ranging from a millisecond to 30 minutes. In one embodiment, the annealing is done by a flash anneal process at about 1200° C. for twenty milliseconds. In certain embodiments, junctions 70 may be formed by diffusion of outer portion dopant (e.g., phosphorus, etc.) into channel region 12' and into inner portion 50 forming an electrical contact there between. With reference to inner portion 50, the respective dopant (e.g. arsenic, etc.) may diffuse much slower than the outer portion dopant in silicon at any temperature due to an atomic size difference relative thereto. As such, the inner portion 50 dopant may not diffuse into channel region 12' through the outer portion 60. Therefore, a high dopant level may be maintained in SD regions to improve contact resistance between SD contacts 100 and inner portion 50 while also allowing for junction 70 to be formed between at least the channel region 12' and the outer portion 60 while limiting the danger of shorting. In certain embodiments, the inner portion 50 dopant (e.g. arsenic, etc.) is in-situ doped to limit excessive outer portion 60 dopant (e.g., phosphorus, etc.) diffusion since point defects would be limited.

Figure 9:
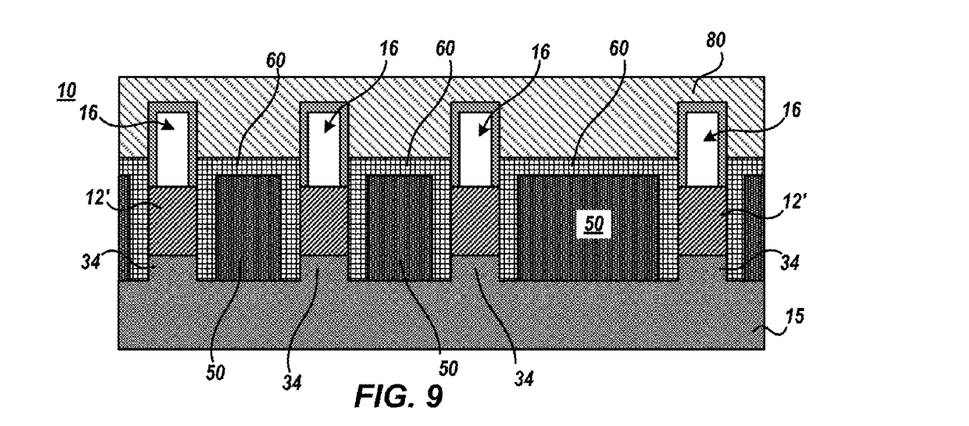

FIG. 9 depicts a cross section view of an exemplary semiconductor structure 10 at an intermediate stage of semiconductor device fabrication, in accordance with various embodiments of the present invention. At this stage of fabrication, interlayer dielectric (ILD) 80 is formed upon structure 10. For example, ILD 80 may be formed gate stack 16 and outer portion 60 (if formed upon inner portion 50) and inner portion 50 (e.g., if upper surface 61 of outer portion 60 is coplanar with upper surface 51 of inner portion 50, etc.), etc. ILD 80 may be formed to a thickness to cover gate stacks 16 (e.g. an upper surface of ILD 80 is above the upper surfaces of gates stacks 16, etc.). In various embodiments of the present invention the materials of ILD 80 and material of inner portion 50 are chosen to provide for subsequent selective etching. Such requirement may be satisfied by different combinations of material selections. ILD 80 may be formed by any now known or later developed techniques such as plasma vapor deposition, etc.

Figure 10:
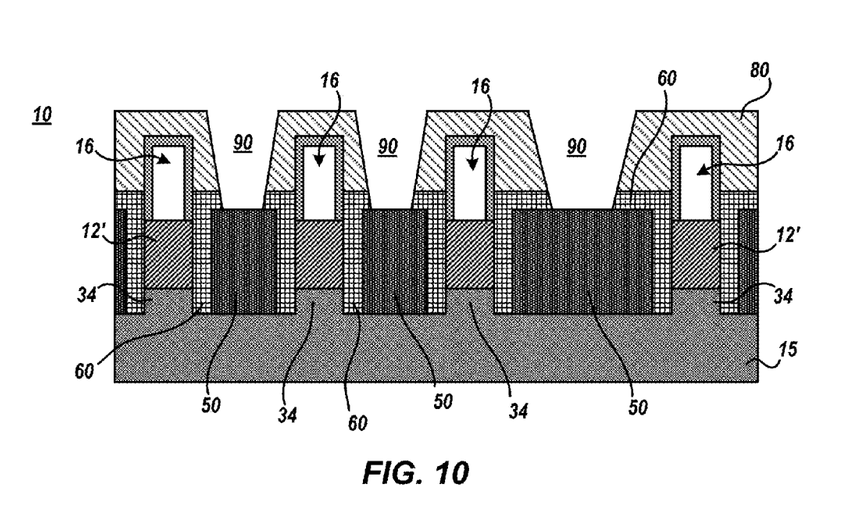

FIG. 10 depicts a cross section view of an exemplary semiconductor structure 10 at an intermediate stage of semiconductor device fabrication, in accordance with various embodiments of the present invention. At this stage of fabrication, contact trenches 90 are formed upon structure 10. Contact trenches 90 may be formed utilizing photolithography and etch process steps. Specifically, a pattern is produced by applying a masking layer such as a photoresist or photoresist with an underlying hardmask, to the surface to ILD 80. The photoresist is exposed to a pattern of radiation and the pattern is developed into the photoresist utilizing a resist developer. Once the patterning of the photoresist is completed, the sections covered by the photoresist are protected while the exposed regions are removed using a selective etching process that removes the unprotected regions. In the present fabrication stage, the etching is selective to remove the material of ILD 80 while not removing material inner portion 50. As such, a respective portion of inner portion 50 may be exposed within the contact trenches 90. In some embodiments, material of outer portion 60 above inner portion 50 may be removed during the contact trench 90 formation processes. In some embodiments, material of outer portion 60 above inner portion 50 may be maintained during contact trench 90 formation and thus the material of ILD 80 and material of outer portion 60 may be chosen to provide for a selective removal of ILD 80 selective to the outer portion 60. In various embodiments, contact trenches 90 are formed within SD regions of structure 10 and may be subsequently utilized in forming a contact electrically coupled to respective SD regions.

The patterning and etching techniques may be chosen to obtain a depth and side profile of contact trenches 90 according to design purposes. For instance, contact trenches 90 can be formed by a directional dry etch which can form substantially straight sidewalls or by a wet (or other isotropic) etch process which can form undercuts, etc. Generally, contact trenches 90 may be formed by other known processes without deviating from the spirit of those embodiments herein claimed.

The contact trenches 90 may be self-aligned in that they are formed through ILD 90 using an etch process that is selective to inner portion 50, outer portion 60, etc. That is, the etch process used to form contact trenches 90 may not appreciably remove the material of inner portion 50 or outer portion 60 thereby making the alignment of the mask for the etch process less critical.

In those embodiments where outer portion 60 generally above inner portion 50 is maintained subsequent to trench 90 formation, a silicide process may be preformed. For example, a silicide metal layer (e.g., Nickel silicide, platinum silicide, group 1 silicide, group 2 silicide, etc.) may be deposited upon the sidewalls of contact trenches 90 and upon the exposed portions outer portion 60. The silicide metal layer may be formed by any now known or later developed techniques appropriate for the material of silicide metal layer 120, including, but not limited to: chemical vapor deposition (CVD), low pressure CVD (LPCVD), plasma enhanced CVD (PECVD), semi-atmosphere CVD (SACVD), high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic level deposition (ALD), chemical oxidation, molecular beam epitaxy (MBE), plating or evaporation, etc. Silicide metal layer may have a thickness ranging from about 3 nm to about 50 nm. In one embodiment, the silicide metal layer may have a thickness ranging from about 5 nm to about 15 nm. In such silicide processes the material of outer portion 60 above inner portion 50 may be consumed and the dopant of outer portion 60 is plowed resulting in a dopant accumulation at the interface of the silicide layer that even further decreases subsequent contact resistance.

Figure 11:
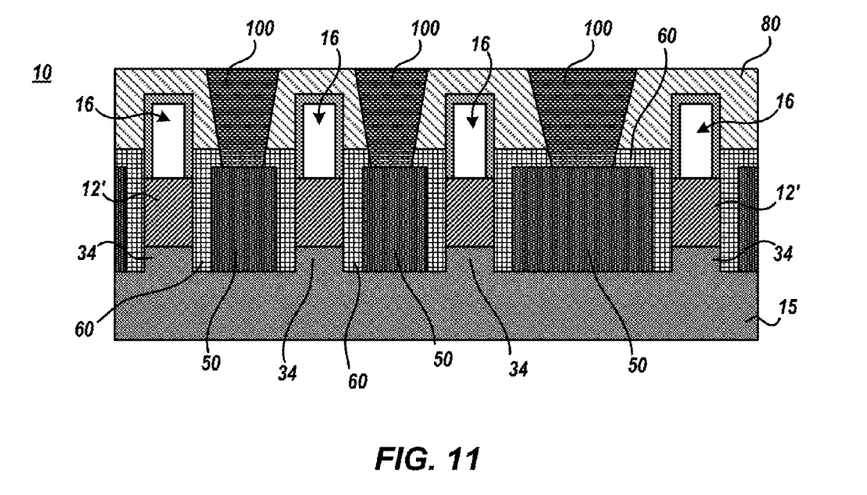

FIG. 11 depicts a cross section view of an exemplary semiconductor structure 10 at an intermediate stage of semiconductor device fabrication, in accordance with various embodiments of the present invention. At this stage of fabrication, contacts 100 are formed by filling contact trenches 90, respectively, with electrically conductive material (e.g., a metal, a metal-containing material, a material comprising a metal).

In certain embodiments, contacts 90 may be e.g. tungsten, copper, etc. Further, contacts 100 provide for an electrical connection to respective active regions e.g. SD regions of semiconductor structure 10. Even further, contacts 100 provide for an electrical connection with another component(s) formed above contacts 100, respectively. Such components may be formed in subsequent Front End of the Line, Middle End of the Line, etc. fabrication steps. In certain embodiments, after forming contacts 100, structure 10 may be planarized utilizing e.g. a chemical mechanical polish (CMP) so that an upper surface of ILD 80, upper surfaces of contacts 100 are coplanar. For clarity, structure 10 may undergo further fabrication steps that may add or remove layers, materials, etc. in further front end of line, middle end of line, or back end of line fabrication steps to form a semiconductor device.

In certain embodiments, as shown in, a liner such as titanium nitride may be deposited within contact trenches 90 prior to contact 100 formation. For example, liner may be formed upon the sidewalls of contact trenches 90. In such embodiments, the remaining contact trenches 90 may be filled with electrically conductive material forming contacts 100.

Figure 12:
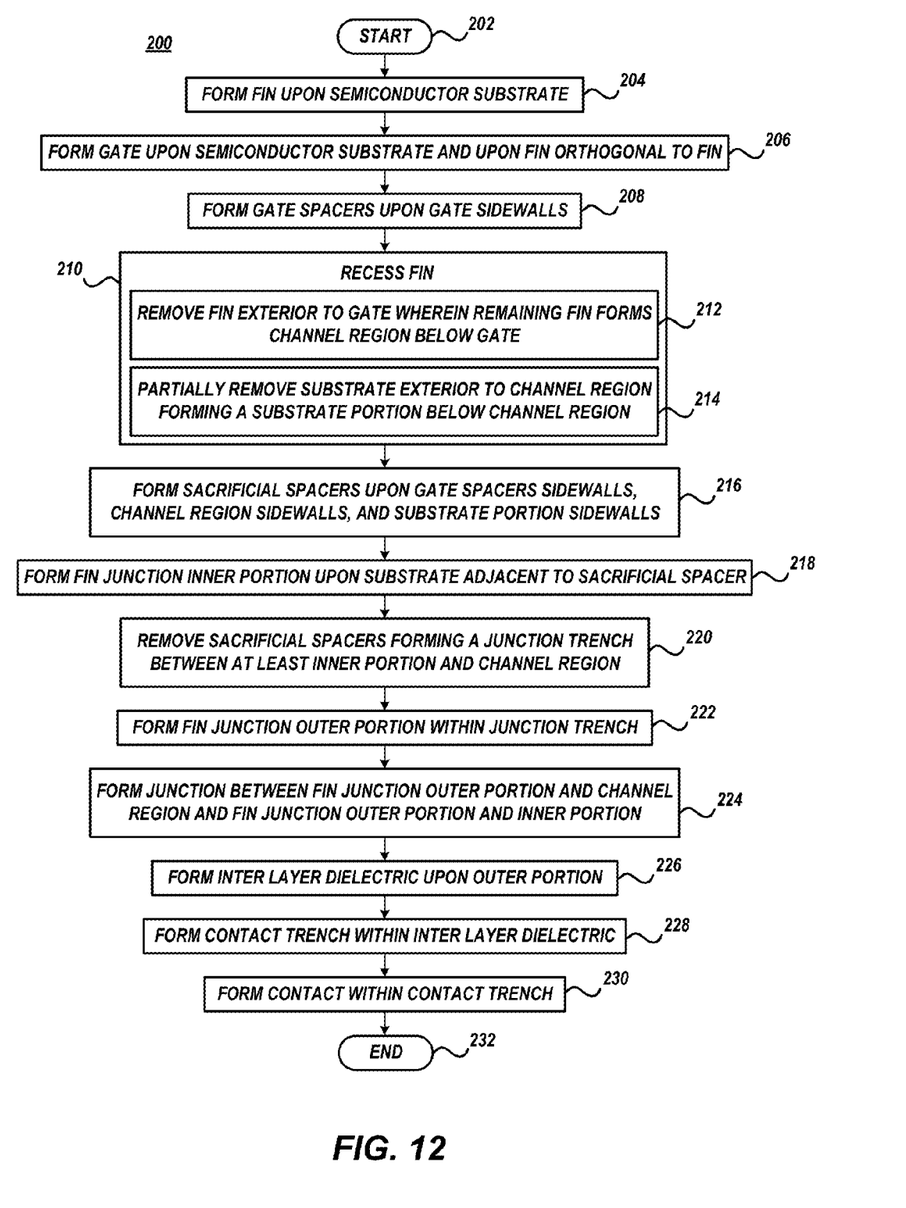
FIG. 12 depicts an exemplary fabrication process flow method, in accordance with various embodiments of the present invention.

FIG. 12 depicts an exemplary process flow method 200 for manufacturing a semiconductor device, in accordance with various embodiments of the present invention. In various embodiments, method 200 may be utilized to form semiconductor structure 10 that includes a bi-portioned junction 65 wherein a junction 70 is formed by diffusion of outer portion 60 dopant (e.g., phosphorus, etc.) into channel region 12' and into inner portion 50 forming an electrical contact there between. Utilizing method 200, a high dopant level may be maintained in SD regions to improve contact resistance between SD contacts 100 and inner portion 50 while also allowing for junction 70 to be formed between at least the channel region 12' and the outer portion 60 while limiting the danger of shorting.

Method 200 begins at block 202 and continues by forming a fin 12 (block 204) and forming a gate (block 206) upon a substrate of a semiconductor structure. The gate may be formed upon the substrate and upon the fin generally orthogonal to the fin. In certain embodiments, the fin is a bulk fin formed from the substrate. In other embodiments, the substrate is a layered substrate and the fin is formed thereupon. In embodiments, the gate may be a dummy gate that is later removed and replaced with a functional gate or a functional gate. In certain embodiments, a gate dielectric is formed upon substrate and fins utilizing a conventional deposition process including, for example, chemical vapor deposition, plasma enhanced chemical vapor deposition or chemical solution deposition. The gate may be formed upon the gate dielectric and a gate cap may be formed atop the gate.

Method 200 may continue with forming gate spacers upon the gate sidewalls (block 208). For example, the gate spacers may be formed on sidewalls of gate, gate cap, etc. Method 200 may continue with recessing the fin (block 210). In certain embodiments, the fin may be recessed by forming a recess region (e.g. recess region 30). In certain embodiments, the recess region may be formed by removing the fin exterior to the gate (block 212), wherein the remaining fin forms a channel region below the gate. The recess region may be further formed by partially removing the substrate exterior to the channel region (block 214), wherein the remaining substrate below the channel region forms a substrate portion. The combination of the gate spacers, gate, gate cap, and/or gate dielectric layer, etc. may be referred to as a gate stack.

Method 200 may continue with forming sacrificial spacers upon the gate stack sidewalls, channel region sidewalls, and substrate portion sidewalls (block 216). The sacrificial spacer may include a first portion formed upon first gate stack, channel region, and substrate portion sidewalls and a second portion formed upon opposing gate stack, channel region, and substrate portion sidewalls. The sacrificial spacer may be a dielectric material, such as an oxide, nitride, oxynitride, silicon nitride, silicon oxide, silicon oxynitride, amorphous carbon, or any other suitable combination thereof that is selective to the material of the gate spacer such that the material of gate spacer may be retained during the removal of sacrificial spacer. The thickness of the first portion and second portion of sacrificial spacer is chosen so that the sacrificial spacer remains subsequent to an epitaxy pre-cleaning processes that cleans an exposed surface of the substrate within the recess region. The width of the exposed surface may be a desired contact width of a SD contact and/or SD region.

Method 200 may continue with forming the by-portion junction inner portion upon the substrate adjacent to the sacrificial spacer (block 218). In certain embodiments, the inner portion is epitaxially grown material utilizing the substrate as a seed surface. The inner portion epitaxial growth may be carried out in a selective manner, meaning that the epitaxial growth occurs only over exposed semiconductor surfaces, for instance from the exposed surface of substrate adjacent to the sacrificial spacer while other surfaces (e.g. surfaces of dielectrics) stay essentially free of the epitaxy material. In certain embodiments, inner portion epitaxy material may be doped. Such doping may be performed during the epitaxial growth, in so called in-situ doping schemes. Both p-type and n-type dopants are well known in the art, and any of them may be used in the embodiments of the present disclosure for doping inner portion. In certain embodiments, inner portion epitaxy material may be highly doped. For example, inner portion may be highly arsenic doped Si with a dopant concentration between $5 \times 10^{20}$ cm$^{-3}$-$8 \times 10^{20}$ cm$^{-3}$.

Method 200 may continue with removing the sacrificial spacer to form a junction trench between the inner portion of the bi-portion junction and the channel region (block 220). In some embodiments the junction trench is formed between the inner portion of the bi-portion junction and the gate stack, channel region, and substrate portion. The sacrificial spacer may be selectively removed to expose gate stack sidewalls, channel region sidewalls, and/or substrate portion sidewalls, etc. The sacrificial spacer may be removed using any suitable etching technique such as dry etch, wet etch, or combination of both to selectively remove sacrificial spacers while retaining the gate spacers.

Method 200 may continue with forming the bi-portion junction outer portion within the junction trench (block 222). In various embodiments, outer portion is formed by epitaxial material grown from substrate exposed by the junction trench. The epitaxial growth may occur only over exposed semiconductor surfaces, for instance from an exposed surface of substrate that is exposed by junction trench while other surfaces (e.g. surfaces of dielectrics) stay essentially free of the epitaxy material. In certain embodiments, the epitaxial growth may be timed and stopped such that a top surface of the outer portion is coplanar with a top surface of the inner portion. In other embodiments, epitaxial growth may continue such that outer portion material may form upon the inner portion. In certain embodiments, outer portion epitaxy material may be doped. Such doping may be performed during the epitaxial growth, in so called in-situ doping schemes, as known in the art. The dopant type of outer portion may be similar to the dopant type of inner portion. In certain embodiments, outer portion epitaxy material may be highly doped. For example, outer portion may be highly phosphorus doped Si with a dopant concentration between $2 \times 10^{20}$ cm$^{-3}$-$4 \times 10^{20}$ cm$^{-3}$. Therefore, the dopant concentration of outer portion may be less than the dopant concentration of inner portion. The dopant of inner portion may diffuse more slowly than the dopant of outer portion so that the relatively lower dopant concentration of outer portion may be maintained to limit the risk of transistor shorting. In certain embodiments, excess outer portion material (e.g., material above inner portion, etc.) may be removed by e.g., an etching process such as a short directional RIE with the dopant of inner portion as endpoint detection so that the outer portion material generally above the inner portion is removed selective to the material of the inner portion.

Method 200 may continue with forming a junction between the bi-portioned outer portion and the channel region and between the outer portion and the inner portion (block 224). In certain embodiments, the junction may be formed by subjecting the structure to a thermal heating process. In certain embodiments, the junction is formed by diffusion of outer portion dopant (e.g., phosphorus, etc.) into the channel region and into inner portion forming an electrical contact there between. A high dopant level may be maintained in the inner portion to improve contact resistance while also allowing for the junction to be formed between the channel region and the lower doped outer portion to limit the possibility of structure shorting.

Method 200 may continue with forming an inter layer dielectric (block 226). In certain embodiments, where outer portion is maintained above inner portion, the ILD may be formed upon the outer portion and upon the gate stacks. In those embodiments where outer portion is removed or otherwise consumed, the ILD may be formed generally upon the inner portion. ILD may be formed to a thickness to generally cover the gate stack.

Method 200 may continue with forming a trench (block 228). The trench may be a SD contact trench, etc. The contact trench may be formed utilizing photolithography and etch process steps. The etching may be selective to remove the material of ILD while not removing material of the bi-portioned junction. As such, a respective portion the bi-portioned junction may be exposed within the contact trench. The contact trench may be self-aligned in that they are formed through ILD using an etch process that is selective the bi-portioned junction (e.g. the inner portion, etc.). That is, the etch process used to form the trench may not appreciably remove the material of e.g., the inner portion. Method 200 may continue with forming silicide metal layer within the contact trench to consume the outer portion material above the inner portion.

Method 200 may continue with forming a contact within the contact trench (block 230). The contact may be formed by filling the contact trench with electrically conductive material. Contacts may provide for an electrical connection to the bi-portioned junction (i.e., SD region) of the semiconductor structure. Even further, the contact may provide for an electrical connection with another component(s) formed above contacts the contact. For clarity, method 200 may continue with further fabrication steps that may add or remove layers, materials, etc. in further front end of line, middle end of line, or back end of line fabrication steps to form a semiconductor device. Method 200 ends at block 232.

Figure 13:
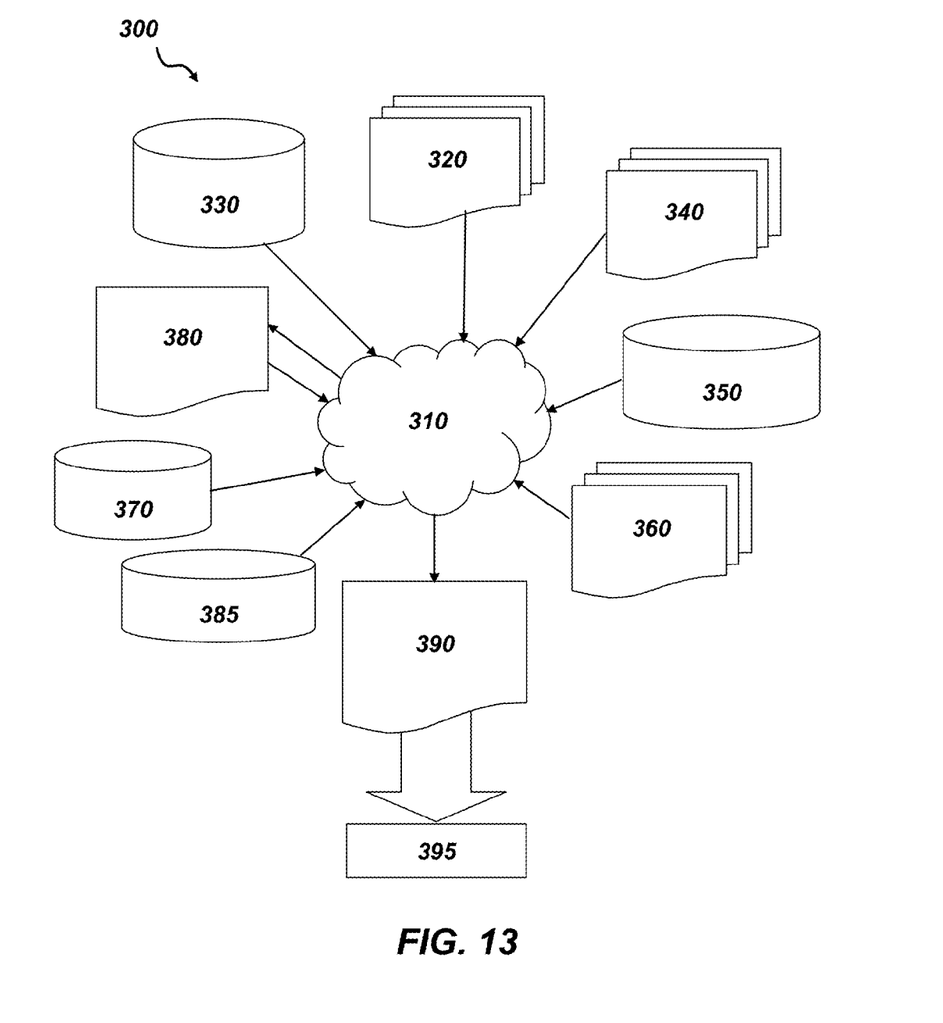
FIG. 13 depicts a flow diagram of a design process used in semiconductor design, manufacture, and/or test, in accordance with various embodiments of the present invention.

Referring now to FIG. 13, a block diagram of an exemplary design flow 300 used for example, in semiconductor integrated circuit (IC) logic design, simulation, test, layout, and/or manufacture is shown. Design flow 300 includes processes, machines and/or mechanisms for processing design structures or devices to generate logically or otherwise functionally equivalent representations of the structures and/or devices described above and shown in FIGS. 1-11.

The design structures processed and/or generated by design flow 300 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 300 may vary depending on the type of representation being designed. For example, a design flow 300 for building an application specific IC (ASIC) may differ from a design flow 300 for designing a standard component or from a design flow 300 for instantiating the design into a programmable array, for example a programmable gate array (PGA) or a field programmable gate array (FPGA) offered by Altera® Inc. or Xilinx® Inc.

FIG. 13 illustrates multiple such design structures including an input design structure 320 that is preferably processed by a design process 310. Design structure 320 may be a logical simulation design structure generated and processed by design process 310 to produce a logically equivalent functional representation of a hardware device. Design structure 320 may also or alternatively comprise data and/or program instructions that when processed by design process 310, generate a functional representation of the physical structure of a hardware device. Whether representing functional and/or structural design features, design structure 320 may be generated using electronic computer-aided design (ECAD) such as implemented by a core developer/designer.

When encoded on a machine-readable data transmission, gate array, or storage medium, design structure 320 may be accessed and processed by one or more hardware and/or software modules within design process 310 to simulate or otherwise functionally represent an electronic component, circuit, electronic or logic module, apparatus, device, structure, or system such as those shown in FIGS. 1-11. As such, design structure 320 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 310 preferably employs and incorporates hardware and/or software modules for synthesizing, translating, or otherwise processing a design/simulation functional equivalent of the components, circuits, devices, or structures shown FIGS. 1-11 to generate a Netlist 380 which may contain design structures such as design structure 320. Netlist 380 may comprise, for example, compiled or otherwise processed data structures representing a list of wires, discrete components, logic gates, control circuits, I/O devices, models, etc. that describes the connections to other elements and circuits in an integrated circuit design. Netlist 380 may be synthesized using an iterative process in which netlist 380 is resynthesized one or more times depending on design specifications and parameters for the device. As with other design structure types described herein, netlist 380 may be recorded on a machine-readable data storage medium or programmed into a programmable gate array. The storage medium may be a non-volatile storage medium such as a magnetic or optical disk drive, a programmable gate array, a compact flash, or other flash memory. Additionally, or in the alternative, the storage medium may be a system or cache memory, buffer space, or electrically or optically conductive devices in which data packets may be intermediately stored.

Design process 310 may include hardware and software modules for processing a variety of input data structure types including Netlist 380. Such data structure types may reside, for example, within library elements 330 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 340, characterization data 350, verification data 360, design rules 370, and test data files 385 which may include input test patterns, output test results, and other testing information. Design process 310 may further include, for example, standard mechanical design processes such as stress analysis, thermal analysis, mechanical event simulation, process simulation for operations such as casting, molding, and die press forming, etc.

One of ordinary skill in the art of mechanical design can appreciate the extent of possible mechanical design tools and applications used in design process 310 without deviating from the scope and spirit of the invention claimed herein. Design process 310 may also include modules for performing standard circuit design processes such as timing analysis, verification, design rule checking, place and route operations, etc.

Design process 310 employs and incorporates logic and physical design tools such as HDL compilers and simulation model build tools to process design structure 320 together with some or all of the depicted supporting data structures along with any additional mechanical design or data (if applicable), to generate a second design structure 390. Design structure 390 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures).

Similar to design structure 320, design structure 390 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-11. In one embodiment, design structure 390 may comprise a compiled, executable HDL simulation model that functionally simulates the devices shown in FIGS. 1-11.

Design structure 390 may also employ a data format used for the exchange of layout data of integrated circuits and/or symbolic data format (e.g. information stored in a GDSII (GDS2), GL1, OASIS, map files, or any other suitable format for storing such design data structures). Design structure 390 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-11. Design structure 390 may then proceed to a stage 395 where, for example, design structure 390: proceeds to tape-out, is released to manufacturing, is released to a mask house, is sent to another design house, is sent back to the customer, etc.

The accompanying figures and this description depicted and described embodiments of the present invention, and features and components thereof. Those skilled in the art will appreciate that any particular nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

References herein to terms such as "vertical", "horizontal", etc. are made by way of example, and not by way of limitation, to establish a frame of reference. The term "horizontal" as used herein is defined as a plane parallel to the conventional plane or surface of the substrate, regardless of the actual spatial orientation of the semiconductor substrate. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

The invention claimed is:

1. A semiconductor device comprising:
   a channel region upon a semiconductor substrate;
   a gate stack upon the channel region, and;
   a bi-portioned junction comprising an inner portion upon the semiconductor substrate and an outer portion that electrically connects the channel region and the inner portion.

2. The semiconductor device of claim 1, wherein an upper surface of the outer junction portion is coplanar with an upper surface of the inner junction portion.

3. The semiconductor device of claim 1, wherein the inner junction portion is doped epitaxy material grown from the semiconductor substrate.

4. The semiconductor device of claim 3, wherein the outer junction portion is doped epitaxy material grown from the semiconductor substrate exterior to the channel region.

5. The semiconductor device of claim 4, wherein the dopant concentration of the outer junction portion is less than the dopant concentration of the inner junction portion.

6. The semiconductor device of claim 1, further comprising:
   a contact trench within an inter layer dielectric that exposes the inner portion, and;
   a contact within the contact trench.

7. The semiconductor device of claim 1, wherein the bi-portioned junction is the source or drain region of the semiconductor device.

8. The semiconductor device of claim 7, wherein the channel region of the semiconductor device is in a fin adjacent to and contacting the outer junction portion.

9. The semiconductor device of claim 8, wherein:
   the gate stack comprises: a gate formed on the fin; and a gate cap and a spacer formed on the gate; and
   the outer junction portion directly contacts the fin and the spacer.

10. The semiconductor device of claim 9, wherein the outer junction portion directly contacts a vertical sidewall of the semiconductor substrate below the fin.

11. The semiconductor device of claim 8, wherein the bi-portioned junction is formed in a recess region in the semiconductor substrate.

12. The semiconductor device of claim 11, wherein a bottom surface of the recess region is below an upper surface of the semiconductor substrate.

13. The semiconductor device of claim 12, wherein a bottom surface of the inner junction portion is below a bottom surface of the fin.

14. The semiconductor device of claim 11, wherein the outer junction portion is formed on sidewalls and an upper surface of the inner junction portion.

15. The semiconductor device of claim 14, further comprising a contact that extends through the outer junction portion and contacts the upper surface of the inner junction portion.

16. The semiconductor device of claim 15, wherein:
   the contact extends through an interlayer dielectric;
   the interlayer dielectric contacts an upper surface of the outer junction portion; and
   the interlayer dielectric contacts the gate stack.

* * * * *